United States Patent
Sung et al.

(10) Patent No.: US 9,185,322 B2
(45) Date of Patent: Nov. 10, 2015

(54) DIGITAL VIDEO BROADCAST RECEIVER

(71) Applicant: ALi Corporation, Hsinchu (TW)

(72) Inventors: Hou-Kuan Sung, Hsinchu (TW);
Chih-Yu Chuang, Hsinchu (TW);
Yue-Yong Chen, Hsinchu (TW)

(73) Assignee: ALi Corporation, Hsinchu (TW)

( * ) Notice: Subject to any disclaimer, the term of this patent is extended or adjusted under 35 U.S.C. 154(b) by 15 days.

(21) Appl. No.: 14/255,434

(22) Filed: Apr. 17, 2014

(65) Prior Publication Data

US 2015/0085959 A1    Mar. 26, 2015

(30) Foreign Application Priority Data

Sep. 24, 2013  (CN) .......................... 2013 1 0437368

(51) Int. Cl.
*H03K 9/00*  (2006.01)
*H04L 27/00*  (2006.01)
*H04N 5/44*  (2011.01)
*H04L 27/22*  (2006.01)
*H03L 7/00*  (2006.01)
*H04N 5/455*  (2006.01)

(52) U.S. Cl.
CPC .. *H04N 5/44* (2013.01); *H03L 7/00* (2013.01); *H04L 27/22* (2013.01); *H04N 5/455* (2013.01)

(58) Field of Classification Search
USPC ............... 375/316, 235; 455/165.1, 183.1, 76
See application file for complete search history.

(56) References Cited

U.S. PATENT DOCUMENTS

| | | | |
|---|---|---|---|
| 7,970,373 B2 | 6/2011 | Dauphinee | |
| 2007/0111675 A1* | 5/2007 | Arayashiki et al. | ............. 455/78 |
| 2011/0105068 A1 | 5/2011 | Reddy et al. | |
| 2013/0101012 A1 | 4/2013 | Toosi et al. | |
| 2013/0182804 A1* | 7/2013 | Yutaka et al. | ................. 375/347 |

* cited by examiner

*Primary Examiner* — Nader Bolourchi
(74) *Attorney, Agent, or Firm* — J.C. Patents (57) ABSTRACT

A digital video broadcast receiver including a frequency synthesizer, a plurality of frequency dividing-phase shifting circuits, an antenna and a plurality of signal processing modules is provided. The frequency synthesizer synthesizes a first frequency signal. The frequency dividing-phase shifting circuits individually perform a frequency dividing-phase shifting operation on the first frequency signal to generate a plurality of first signals having different frequencies and a plurality of second signals corresponding to the first signals, where each of the first signals is orthogonal to the corresponding second signal. The antenna receives a radio frequency signal. The signal processing modules respectively obtain a plurality of signal components belonging to different sub-bands from the radio frequency signal according to the first signals and the second signals.

10 Claims, 4 Drawing Sheets

DIGITAL VIDEO BROADCAST RECEIVER

CROSS-REFERENCE TO RELATED APPLICATION

This application claims the priority benefit of China application serial no. 201310437368.X, filed on Sep. 24, 2013. The entirety of the above-mentioned patent application is hereby incorporated by reference herein and made a part of this specification.

BACKGROUND

1. Technical Field

The invention relates to a receiver. Particularly, the invention relates to a digital video broadcast (DVB) receiver.

2. Related Art

Along with development of technology, more and more users start to receive and watch a variety of programs through a digital video broadcast (DVB) approach. Generally, various DVB signals are received through a DVB receiver connected to a player device such as a television.

Generally, the conventional DVB receiver individually obtains signal components belonging to different sub-bands from a received radio frequency (RF) signal by using a plurality of frequency synthesizers. However, since the frequency synthesizers respectively have components such as a voltage-controlled oscillator (VCO) (which is used for producing a local oscillation signal), the conventional DVB receiver could have an adverse pulling effect due to too close distance between the frequency synthesizers.

Moreover, according to a so-called full band capture technique, an ultrahigh speed analog-to-digital converter (ADC) is configured in the DVB receiver to sample all of the considered sub-bands. However, such method requires an ADC of a high specification (for example, with an extremely high sampling frequency), so that the cost of the DVB receiver is rather high.

SUMMARY

Accordingly, the invention is directed to a digital video broadcast receiver, in which a single frequency synthesizer is used to obtain signal components belonging to different sub-bands.

The invention provides a digital video broadcast receiver including a frequency synthesizer, a plurality of frequency dividing-phase shifting circuits, an antenna and a plurality of signal processing modules. The frequency synthesizer synthesizes a first frequency signal. The frequency dividing-phase shifting circuits are coupled to the frequency synthesizer. The frequency dividing-phase shifting circuits individually perform a frequency dividing-phase shifting operation on the first frequency signal to generate a plurality of first signals having different frequencies and a plurality of second signals corresponding to the first signals, where each of the first signal is orthogonal to the corresponding second signal. The antenna receives a radio frequency signal. The signal processing modules are coupled to the antenna and the frequency dividing-phase shifting circuits, and respectively obtain a plurality of signal components belonging to different sub-bands from the radio frequency signal according to the first signals and the second signals.

In an embodiment of the invention, the first frequency signal is a first differential signal, and each of the frequency dividing-phase shifting circuits includes a first frequency divider, a second frequency divider, a first D-type flip-flop and a second D-type flip-flop. The first frequency divider is coupled to the frequency synthesizer, and divides a frequency of the first differential signal by a first factor to generate a second differential signal. The second frequency divider is coupled to the first frequency divider, and divides a frequency of the second differential signal by a second factor to generate a third differential signal. The first D-type flip-flop is coupled to the first frequency divider and the second frequency divider, and outputs a first differential oscillation signal according to the second differential signal and the third differential signal. The first differential oscillation signal is one of the first signals. The second D-type flip-flop is coupled to the first frequency divider and the second frequency divider, and outputs a second differential oscillation signal according to the second differential signal and the third differential signal. The second differential oscillation signal is one of the second signals. The first differential oscillation signal and the second differential oscillation signal are orthogonal to each other.

In an embodiment of the invention, the second factor is 2.

In an embodiment of the invention, the second differential signal has a first component and a second component inverted to each other, and the third differential signal has the first component and the second component inverted to each other. The first D-type flip-flop has a first clock input terminal, a second clock input terminal, a first data terminal and a second data terminal. The first clock input terminal of the first D-type flip-flop receives the first component of the second differential signal. The second clock input terminal of the first D-type flip-flop receives the second component of the second differential signal. The first data terminal of the first D-type flip-flop receives the first component of the third differential signal. The second data terminal of the first D-type flip-flop receives the second component of the third differential signal. The second D-type flip-flop has a first clock input terminal, a second clock input terminal, a first data terminal and a second data terminal. The first clock input terminal of the second D-type flip-flop receives the second component of the second differential signal. The second clock input terminal of the second D-type flip-flop receives the first component of the second differential signal. The first data terminal of the second D-type flip-flop receives the first component of the third differential signal. The second data terminal of the second D-type flip-flop receives the second component of the third differential signal.

In an embodiment of the invention, each of the signal processing modules includes a first mixer and a second mixer. The first mixer is coupled to a specific frequency dividing-phase shifting circuit and the antenna, and mixes the radio frequency signal and a first differential oscillation signal to generate a first sub-band signal. The specific frequency dividing-phase shifting circuit is one of the frequency dividing-phase shifting circuits, and the first differential oscillation signal is one of the first signals. The second mixer is coupled to the specific frequency dividing-phase shifting circuit and the antenna, and mixes the radio frequency signal and a second differential oscillation signal to generate a second sub-band signal orthogonal to the first sub-band signal. The second differential oscillation signal is one of the second signals. The first sub-band signal and the second sub-band signal belong to a same sub-band.

In an embodiment of the invention, each of the signal processing modules further includes a first filter, a first amplifier, a first analog-to-digital converter, a second filter, a second amplifier and a second analog-to-digital converter. The first filter is coupled to the first mixer, and filters the first sub-band signal. The first amplifier is coupled to the first filter, and amplifies the filtered first sub-band signal to generate a first amplified signal. The first analog-to-digital converter is coupled to the first amplifier, and samples the first amplified signal to generate a first digital signal. The second filter is coupled to the second mixer, and filters the second sub-band signal. The second amplifier is coupled to the second filter, and amplifies the filtered second sub-band signal to generate a second amplified signal. The second analog-to-digital converter is coupled to the second amplifier, and samples the second amplified signal to generate a second digital signal.

In an embodiment of the invention, the digital video broadcast receiver further includes a specific frequency divider, which is coupled to the frequency synthesizer, the first analog-to-digital converter and the second analog-to-digital converter, and performs a frequency dividing operation on the first frequency signal to generate a sampling signal.

In an embodiment of the invention, the first analog-to-digital converter samples the first amplified signal according to the sampling signal to generate the first digital signal. Moreover, the second analog-to-digital converter samples the second amplified signal according to the sampling signal to generate the second digital signal.

In an embodiment of the invention, the digital video broadcast receiver further includes a low noise amplifier. The low noise amplifier has an input terminal and an output terminal. The input terminal of the low noise amplifier is coupled to the antenna, and the output terminal of the low noise amplifier is coupled to the signal processing modules for providing the amplified radio frequency signal to the signal processing modules.

In an embodiment of the invention, the digital video broadcast receiver further includes a plurality of band selection filters, which are individually coupled between the output terminal of the low noise amplifier and the corresponding signal processing module.

According to the above descriptions, a useful technical effect of the invention is that the digital video broadcast receiver could produce the first signals and the second signals having different frequencies by using different frequency dividing-phase shifting circuits in case that only a single frequency synthesizer is included. As a result, the various components included in the signal processing modules could be implemented by components with a lower specification, so as to reduce the cost of the digital video broadcast receiver. Moreover, since the digital video broadcast receiver of the invention only includes the single frequency synthesizer, the adverse pulling effect is avoided, so as to achieve an effect of low power consumption.

According to the above descriptions, the digital video broadcast receiver could produce the first signals and the second signals having different frequencies by using different frequency dividing-phase shifting circuits in case that only a single frequency synthesizer is included.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
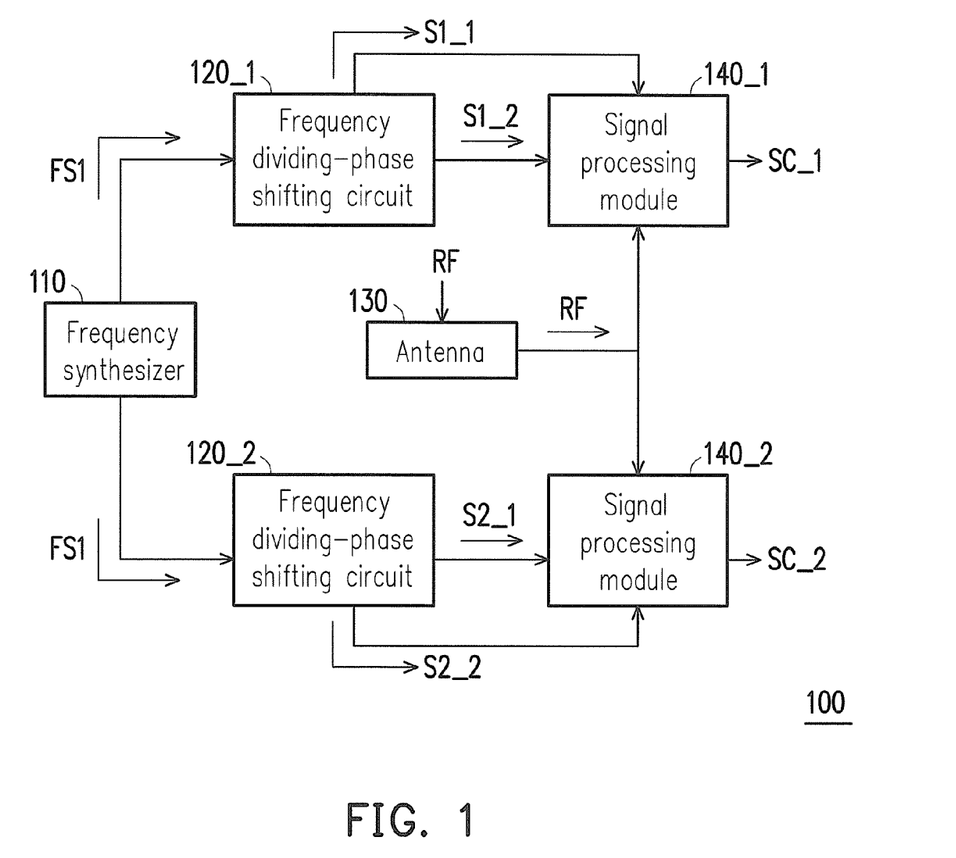
FIG. 1 is a schematic diagram of a digital video broadcast (DVB) receiver according to an embodiment of the invention.

FIG. 1 is a schematic diagram of a digital video broadcast (DVB) receiver according to an embodiment of the invention. In the present embodiment, the DVB receiver 100 includes a frequency synthesizer 110, frequency dividing-phase shifting circuits 120_1 and 120_2, an antenna 130 and signal processing modules 140_1 and 140_2. The DVB receiver 100 is, for example, a receiver capable of receiving DVB-satellite transmission (DVB-S), DVB-satellite transmission $2^{nd}$ generation (DVB-S2), DVB-cable (DVB-C), $2^{nd}$ generation DVB-cable (DVB-C2), DVB-terrestrial (DVB-T), DVB-handheld (DVB-H) or other DVB standard signals. The frequency synthesizer 110 synthesizes a first frequency signal FS1 according to a standard adopted by the DVB receiver 100. For example, when the DVB receiver 100 receives signals of the DVB-S standard, the first frequency signal FS1 synthesized by the frequency synthesizer 110 could be adjusted to a signal with a frequency of 7.452 GHz. For another example, when the DVB receiver 100 receives signals of the DVB-C standard, the first frequency signal FS1 synthesized by the frequency synthesizer 110 could be adjusted to a signal with a frequency of 2.997 GHz.

The frequency dividing-phase shifting circuits 120_1 and 120_2 are respectively coupled to the frequency synthesizer 110. The frequency dividing-phase shifting circuits 120_1 and 120_2 could individually perform a frequency dividing-phase shifting operation on the first frequency signal FS1 to generate first signals S1_1 and S2_1 having different frequencies and second signals S12 and S2_2 corresponding to the first signals S1_1 and S2_1. The first signal S1_1 is orthogonal to the corresponding second signal S1_2, and the first signal S2_1 is orthogonal to the corresponding second signal S2_2. Detailed structures and related characteristics of frequency dividing-phase shifting circuits 120_1 and 120_2 and details of the frequency dividing-phase shifting operation are described below.

The signal processing module 140_1 is coupled to the frequency dividing-phase shifting circuit 120_1 and the antenna 130, and the signal processing module 140_2 is coupled to the frequency dividing-phase shifting circuit 120_2 and the antenna 130. The signal processing module 140_1 obtains a signal component SC_1 from the radio frequency signal RF according to the first signal S1_1 and the second signal S1_2, and the signal processing module 1402 obtains a signal component SC_2 from the radio frequency signal RF according to the first signal S2_1 and the second signal S2_2. The signal components SC_1 and SC_2 belong to different sub-bands.

In brief, in the DVB receiver of the present embodiment, the frequency dividing-phase shifting circuits having different characteristics are used to generate the oscillation signals used for dividing the signal components in the radio frequency signal that belong to different sub-bands in case that only one frequency synthesizer is included.

Figure 2:
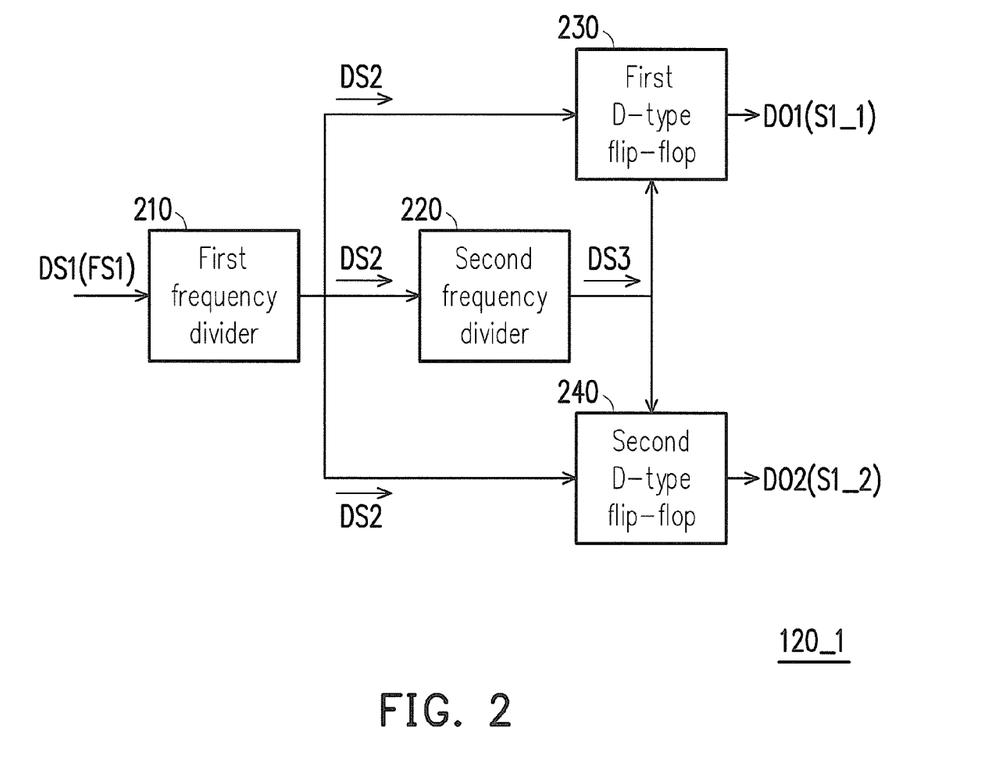
FIG. 2 is a schematic diagram of a frequency dividing-phase shifting circuit according to the embodiment of FIG. 1.

FIG. 2 is a schematic diagram of a frequency dividing-phase shifting circuit according to the embodiment of FIG. 1.

In the present embodiment, the frequency dividing-phase shifting circuit 120_1 includes a first frequency divider 210, a second frequency divider 220, a first D-type flip-flop 230 and a second D-type flip-flop 240. The first frequency divider 210 divides a frequency of the first differential signal (i.e. the first frequency signal FS1) by a first factor (for example, 2, 3 or 5) to generate a second differential signal DS2. The second frequency divider 220 is coupled to the first frequency divider 210, and divides a frequency of the second differential signal DS2 by a second factor (for example, 2) to generate a third differential signal DS3.

The first D-type flip-flop 230 is coupled to the first frequency divider 210 and the second frequency divider 220, and outputs a first differential oscillation signal DO1 according to the second differential signal DS2 and the third differential signal DS3. The second D-type flip-flop 240 is coupled to the first frequency divider 210 and the second frequency divider 220, and outputs a second differential oscillation signal DO2 according to the second differential signal DS2 and the third differential signal DS3. The first differential oscillation signal DO1 and the second differential oscillation signal DO2 respectively correspond to the first signal S1_1 and the second signal S1_2 shown in FIG. 1. As that described above, since the first signal S1_1 and the second signal S1_2 are orthogonal to each other, the first differential oscillation signal DO1 and the second differential oscillation signal DO2 are also orthogonal to each other.

Moreover, although the frequency dividing-phase shifting circuit 120_1 is taken as an example for description in FIG. 2, an operation method and circuit connection method of the frequency dividing-phase shifting circuit 120_2 are similar to that of the frequency dividing-phase shifting circuit 120_1. It should be noted that a difference between the frequency dividing-phase shifting circuits 120_1 and 120_2 is only that the designer could adaptively adjust the first factor of the individual first frequency divider according to frequencies of the first differential oscillation signal DO1 and the second differential oscillation signal DO2 generated by the frequency dividing-phase shifting circuits 120_1 and 120_2.

Figure 3A:
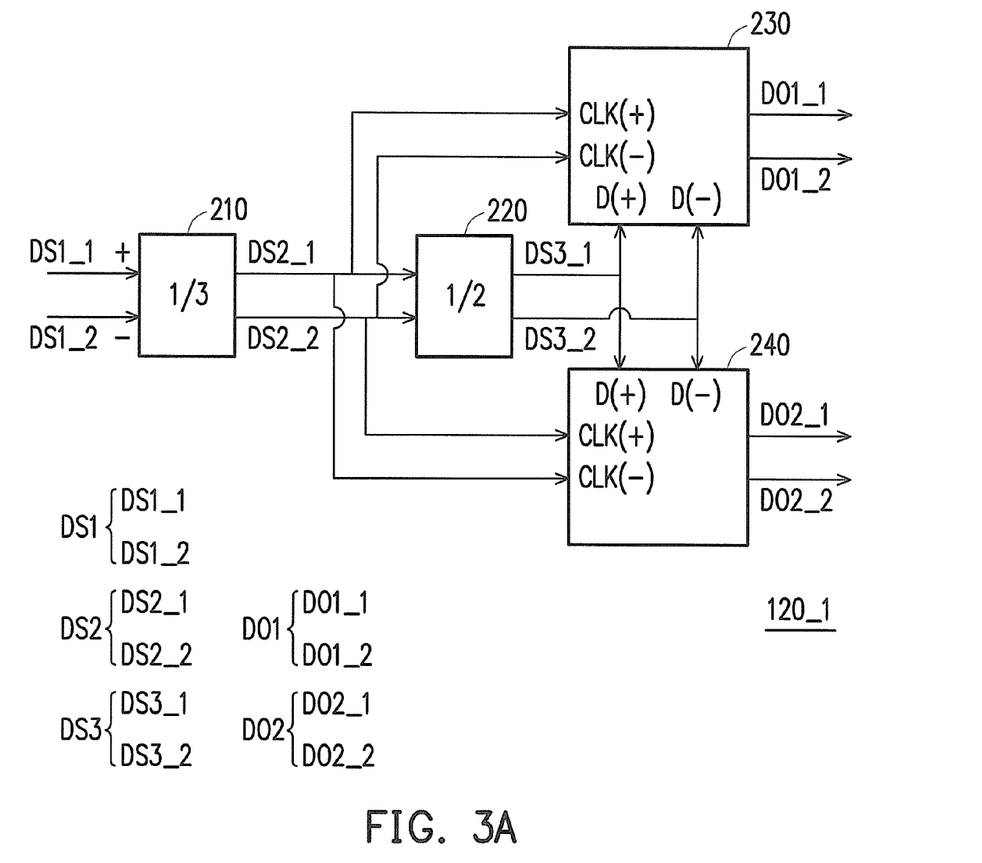
FIG. 3A is a detailed circuit diagram of the frequency dividing-phase shifting circuit of FIG. 2.

FIG. 3A is a detailed circuit diagram of the frequency dividing-phase shifting circuit of FIG. 2. In the present embodiment, the first frequency divider 210, for example, divides frequencies of a first component DS1_1 and a second component DS1_2 included in the first differential signal DS1 by a first factor (for example, 3) to generate a first component DS2_1 and a second component DS2_2 included in the second differential signal DS2. The second frequency divider 220, for example, divides frequencies of the first component DS2_1 and the second component DS2_2 included in the first differential signal DS1 by a second factor (for example, 2) to generate a first component DS3_1 and a second component DS3_2 included in the third differential signal DS3. The first component DS1_1 and the second component DS1_2 are inverted to each other, the first component DS2_1 and the second component DS2_2 are inverted to each other, and the first component DS3_1 and the second component DS3_2 are inverted to each other.

The first D-type flip-flop 230 has a first clock input terminal CLK(+), a second clock input terminal CLK(−), a first data terminal D(+), and a second data terminal D(−). In the first D-type flip-flop 230, the first clock input terminal CLK(+) is, for example, a positive clock input terminal, the second clock input terminal CLK(−) is, for example, a negative clock input terminal, the first data terminal D(+) is, for example, a positive data input terminal, and the second data terminal D(−) is, for example, a negative data input terminal. The first clock input terminal CLK(+) of the first D-type flip-flop 230 receives the first component DS2_1 of the second differential signal DS2. The second clock input terminal CLK(−) of the first D-type flip-flop 230 receives the second component DS2_2 of the second differential signal DS2. The first data terminal D(+) of the first D-type flip-flop 230 receives the first component DS3_1 of the third differential signal DS3. The second data terminal D(−) of the first D-type flip-flop 230 receives the second component DS3_2 of the third differential signal DS3.

Similar to the first D-type flip-flop 230, the second D-type flip-flop 240 also has the first clock input terminal CLK(+), the second clock input terminal CLK(−), the first data terminal D(+), and the second data terminal D(−). In the second D-type flip-flop 240, the first clock input terminal CLK(+) is, for example, a positive clock input terminal, the second clock input terminal CLK(−) is, for example, a negative clock input terminal, the first data terminal D(+) is, for example, a positive data input terminal, and the second data terminal D(−) is, for example, a negative data input terminal. The first clock input terminal CLK(+) of the second D-type flip-flop 240 receives the second component DS2_2 of the second differential signal DS2. The second clock input terminal CLK(−) of the second D-type flip-flop 240 receives the first component DS2_1 of the second differential signal DS2. The first data terminal D(+) of the second D-type flip-flop 240 receives the first component DS3_1 of the third differential signal DS3. The second data terminal D(−) of the second D-type flip-flop 240 receives the second component DS3_2 of the third differential signal DS3.

In brief, a difference between the first D-type flip-flop 230 and the second D-type flip-flop 240 only lies in the connection approach with the first frequency divider 210. In detail, the first D-type flip-flop 230 receives the first component DS2_1 through the first clock input terminal CLK(+). However, the second D-type flip-flop 240 receives the first component DS2_1 through the second clock input terminal CLK(−). On the other hand, the first D-type flip-flop 230 receives the second component DS2_2 through the second clock input terminal CLK(−), and the second D-type flip-flop 240 receives the second component DS2_2 through the first clock input terminal CLK(+).

Under the circuit configuration of FIG. 3A, by suitably adjusting the frequency of the first differential signal DS1 input to the first frequency divider 210, the first differential oscillation signal DO1 (including the first component DO1_1 and the second component DO1_2) and the second differential oscillation signal DO2 (including the first component DO2_1 and the second component DO2_2) that are orthogonal to each other could be generated through operations of the first D-type flip-flop 230 and the second D-type flip-flop 240. The operation method of the circuit shown in FIG. 3A is described with reference of various signals shown in FIG. 3B.

Figure 3B:
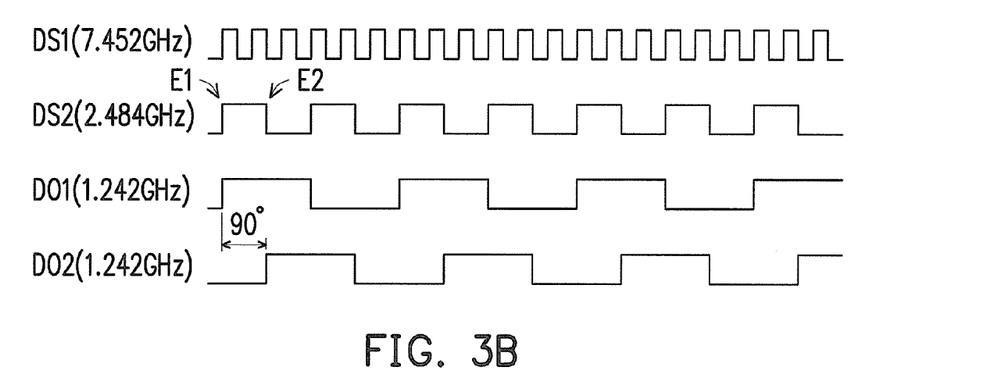
FIG. 3B is a schematic diagram of a plurality of signals according to an embodiment of the invention.

FIG. 3B is a schematic diagram of a plurality of signals according to an embodiment of the invention. Referring to FIG. 3A and FIG. 3B, in the present embodiment, it is assumed that the frequency of the first differential signal DS1 is 7.425 GHz. In this case, after the first frequency divider 210 divides the frequency of the first differential signal DS1 by the first factor (for example, 3), the second differential signal DS2 with a frequency of 2.484 GHz (i.e. 7.425 GHz/3) is generated. Then, after the second frequency divider 220 divides the frequency of the second differential signal DS2 by the second factor (for example, 2), the third differential signal DS3 (i.e. the first component DS3_1 and the second component DS3_2) with a frequency of 1.242 GHz (i.e. 2.484 GHz/2) is generated.

At this time, the first D-type flip-flop 230 could synchronize the third differential signal DS3 to a rising edge (for example, an edge E1) of one of the pulses of the second differential signal DS2, so as to generate the first differential oscillation signal DO1 with the frequency of 1.242 GHz. On the other hand, since the signals received by the two clock input terminals of the second D-type flip-flop 240 are inverted to the signals received by the two clock input terminals of the first D-type flip-flop 230, the second D-type flip-flop 240 could synchronize the third differential signal DS3 to a falling edge (for example, an edge E2) of one of the pulses of the second differential signal DS2, so as to generate the second differential oscillation signal DO2 with the frequency of 1.242 GHz. Further, under a premise that the frequency of the third differential signal DS3 is a half of the frequency of the second differential signal, the first differential oscillation signal DO1 and the second differential oscillation signal DO2 respectively synchronized to the rising edge and the falling edge of the second differential signal DS2 have a phase difference of 90 degrees.

In other words, the frequency dividing-phase shifting operation performed by the frequency dividing-phase shifting circuit 120_1 could be regarded as following operations: frequency dividing operations are sequentially performed on the first differential signal DS1 by the first frequency divider 210 and the second frequency divider 220, and then the first D-type flip-flop 230 and the second D-type flip-flop 240 are used to generate the first differential oscillation signal DO1 and the second differential oscillation signal DO2 which is orthogonal to the first differential oscillation signal DO1.

In other embodiments, the designer could control a frequency ratio between the first differential signal DS1 and the first differential oscillation signal DO1 (or the second differential oscillation signal DO2) by adjusting the first factor of the first frequency divider 210. In detail, since the second factor of the second frequency divider 220 has to be 2 to make the first D-type flip-flop 230 and the second D-type flip-flop 240 generating the first differential oscillation signal DO1 and the second differential oscillation signal DO2 orthogonal to each other, when the designer wants the frequency of the first differential oscillation signal DO1 (or the second differential oscillation signal DO2) to be ⅙ of the frequency of the first differential signal DS1, the designer could design the first factor of the first frequency divider 210 to be 3 (i.e. 6/2=3). As a result, after the first differential signal DS1 is sequentially processed by the first frequency divider 210 and the second frequency divider 220, the second frequency divider 220 could correspondingly generate the third differential signal DS3 with a frequency to be ⅙ of the frequency of the first differential signal DS1. Then, the first D-type flip-flop 230 and the second D-type flip-flop 240 could respectively generate the first differential oscillation signal DO1 and the second differential oscillation signal DO2 orthogonal to each other and having frequencies to be ⅙ of the frequency of the first differential signal DS1 according to the third differential signal DS3.

For another example, when the designer wants the frequency of the first differential oscillation signal DO1 (or the second differential oscillation signal DO2) to be 1/10 of the frequency of the first differential signal DS1, the designer could design the first factor of the first frequency divider 210 to be 5 (i.e. 10/2=5). As a result, after the first differential signal DS1 is sequentially processed by the first frequency divider 210 and the second frequency divider 220, the second frequency divider 220 could correspondingly generate the third differential signal DS3 with a frequency to be 1/10 of the frequency of the first differential signal DS1. Then, the first D-type flip-flop 230 and the second D-type flip-flop 240 could respectively generate the first differential oscillation signal DO1 and the second differential oscillation signal DO2 orthogonal to each other and having frequencies to be 1/10 of the frequency of the first differential signal DS1 according to the third differential signal DS3.

Figure 4:
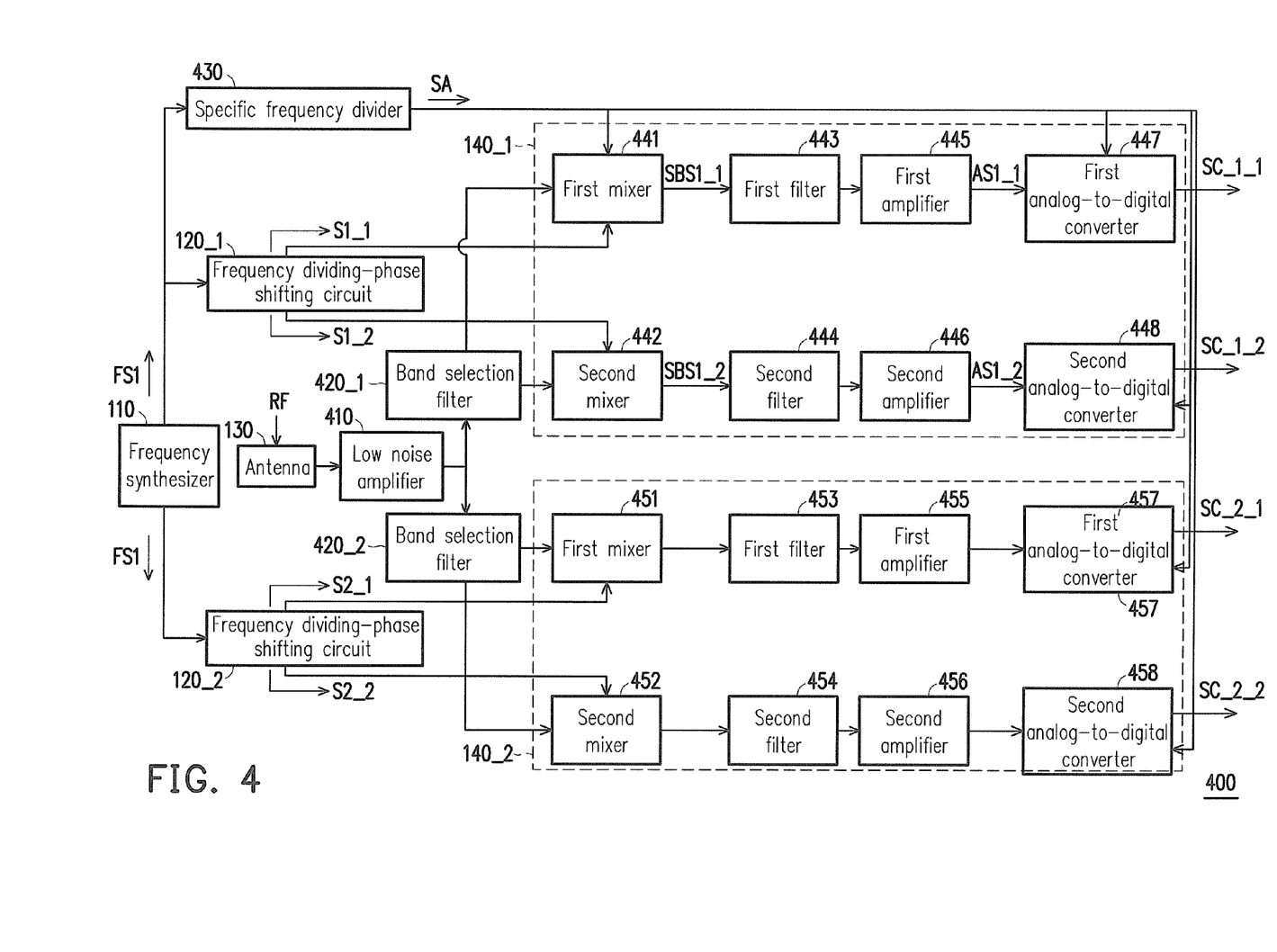
FIG. 4 is a schematic diagram of a DVB receiver according to the embodiment of FIG. 1.

FIG. 4 is a schematic diagram of a DVB receiver according to the embodiment of FIG. 1. In the present embodiment, besides the components illustrated in FIG. 1, the DVB receiver 400 further includes a low noise amplifier (LNA) 410, band selection filters 420_1 and 420_2, and a specific frequency divider 430.

The low noise amplifier 410 has an input terminal and an output terminal. The input terminal of the low noise amplifier 410 is coupled to the antenna 130, and the output terminal of the low noise amplifier 410 is coupled to the signal processing modules 140_1 and 140_2 through the band selection filters 420_1 and 420_2, where the band selection filters 420_1 and 420_2 are respectively coupled between the output terminal of the low noise amplifier 410 and the corresponding signal processing modules 140_1 and 140_2.

In the present embodiment, the signal processing module 140_1 includes a first mixer 441, a second mixer 442, a first filter 443, a second filter 444, a first amplifier 445, a second amplifier 446, a first analog-to-digital converter (ADC) 447 and a second ADC 448.

The first mixer 441 is coupled to the frequency dividing-phase shifting circuit 120_1 (which is regarded as a specific frequency dividing-phase shifting circuit corresponding to the first mixer 441), and is coupled to the antenna 130 through the band selection filter 420_1 and the low noise amplifier 410. The first mixer 441 mixes the radio frequency signal RF and the first signal S1_1 (i.e. the first differential oscillation signal DO1) to generate a first sub-band signal SBS1_1. The first filter 443 is coupled to the first mixer 441 for filtering the first sub-band signal SBS1_1. The first amplifier 445 is coupled to the first filter 443 for amplifying the filtered first sub-band signal SBS1_1 to generate a first amplified signal AS1_1. The first ADC 447 is coupled to the first amplifier 445, and samples the first amplified signal AS1_1 to generate a first digital signal SC_1_1.

The second mixer 442 is coupled to the frequency dividing-phase shifting circuit 120_1, and is coupled to the antenna 130 through the band selection filter 420_1 and the low noise amplifier 410. The second mixer 442 mixes the radio frequency signal RF and the second signal S1_2 (i.e. the second differential oscillation signal DO2) to generate a second sub-band signal SBS1_2, where the second sub-band signal SBS1_2 is orthogonal to the first sub-band signal SBS1_1, and the second sub-band signal SBS1_2 and the first sub-band signal SBS1_1 belong to a same sub-band. The second filter 444 is coupled to the second mixer 442 for filtering the second sub-band signal SBS1_2. The second amplifier 446 is coupled to the second filter 444 for amplifying the filtered first sub-band signal SBS1_2 to generate a second amplified signal AS1_2. The second ADC 448 is coupled to the second amplifier 446, and samples the second amplified signal AS1_2 to generate a second digital signal SC_1_2. In an embodiment, the first digital signal SC_1_1 and the second digital signal SC_1_2 could be regarded as the two components orthogonal to each other that are included in the signal component SC_1 of FIG. 1.

On the other hand, the signal processing module 140_2 includes a first mixer 451, a second mixer 452, a first filter 453, a second filter 454, a first amplifier 455, a second amplifier 456, a first ADC 457 and a second ADC 458.

Regarding the signal processing module 140_2, the included first mixer 451, the first filter 453, the first amplifier 455 and the first ADC 457 could implement similar operations as that of the first mixer 441, the first filter 443, the first amplifier 445 and the first ADC 447 of the signal processing module 140_1 to convert the first signal S2_1 to the first digital signal SC_2_1. Moreover, the second mixer 452, the second filter 454, the second amplifier 456 and the second ADC 458 of the signal processing module 140_2 could implement similar operations as that of the second mixer 442, the second filter 444, the second amplifier 446 and the second ADC 448 of the signal processing module 140_1 to convert the second signal S2_2 to the second digital signal SC_2_2. Similarly, the first digital signal SC_2_1 and the second digital signal SC_2_2 could be regarded as the two components orthogonal to each other that are included in the signal component SC_2 of FIG. 1. Details of the operation method of the signal processing module 140_2 could refer to related descriptions of the signal processing module 140_1, which are not repeated.

The specific frequency divider 430 is coupled to the frequency synthesizer 110, the first ADC 447, the second ADC 448, the first ADC 457 and the second ADC 458. The specific frequency divider 430 performs is a frequency dividing operation on the first frequency signal FS1 to generate a sampling signal SA to the first ADC 447, the second ADC 448, the first ADC 457 and the second ADC 458. The first ADC 447, the second ADC 448, the first ADC 457 and the second ADC 458 could respectively sample the received signals according to the sampling signal SA to generate the first digital signal SC_1_1, the second digital signal SC_1_2, the first digital signal SC_2_1 and the second digital signal SC_2_2. For example, the first ADC 447 could sample the first amplified signal AS1_1 according to the sampling signal SA to generate the first digital signal SC_1_1. Moreover, the second ADC 448 could sample the second amplified signal AS1_2 according to the sampling signal SA to generate the second digital signal SC_1_2. The first ADC 457 and the second ADC 458 could perform operations similar to that of the first ADC 447 and the second ADC 448, which are not repeated.

The first filter 443, the second filter 444, the first filter 453 and the second filter 454 shown in FIG. 4 are, for example, respectively a low-pass filter having a specific frequency band (for example, 316 MHz), though the invention is not limited thereto. Moreover, the first amplifier 445, the second amplifier 446, the first amplifier 455 and the second amplifier 456 are, for example, respectively a programmable gain amplifier (PGA), though the invention is not limited thereto.

In other embodiments, the designer could adjust the frequency of the first frequency signal FS1 according to the DVB standard adopted by the DVB receiver 500. Moreover, the designer could also determine the first factor and the second factor corresponding to each of the frequency dividing-phase shifting circuits according to the signal components to be obtained from the radio frequency signal RF, such that the signal component generated by each of the frequency dividing-phase shifting circuits could fall within the considered sub-band.

For example, when the DVB receiver 500 adopts the DVB-S or DVB-S2 standard, the corresponding radio frequency signal RF, for example, has a frequency falling within a range of 950 MHz to 2.15 GHz. At this time, if the signal component SC_1 (i.e. the first digital signal SC_1_1 and the second digital signal SC_1_2) considered by the designer is a signal around the sub-band of 1.242 GHz, the designer could suitably design the first factor and the second factor corresponding to the frequency dividing-phase shifting circuit 120_1, such that the first frequency signal FS1 is processed by the frequency dividing-phase shifting circuit 120_1 and is converted into the first differential oscillation signal DO1 (i.e. the first signal S1_1) and the second differential oscillation signal DO2 (i.e. the second signal S1_2) orthogonal to each other and having a frequency of 1.242 GHz.

In detail, it is assumed that the frequency of the first frequency signal FS1 is adjusted to 7.452 GHz (i.e., 6 times of 1.242 GHz), the designer could design the first factor and the second factor corresponding to the frequency dividing-phase shifting circuit 120_1 to be 3 and 2. As a result, the frequency dividing-phase shifting circuit 120_1 could convert the first frequency signal FS1 with the frequency of 7.452 GHz into the first differential oscillation signal DO1 (i.e. the first signal S1_1) and the second differential oscillation signal DO2 (i.e. the second signal S1_2) orthogonal to each other and having the frequency of 1.242 GHz.

Then, the signal processing module 140_1 could obtain the signal component SC_1 (i.e. the first digital signal SC_1_1 and the second digital signal SC_1_2) around the sub-band of 1.242 GHz from the radio frequency signal RF according to the first differential oscillation signal DO1 (i.e., the first signal S1_1) and the second differential oscillation signal DO2 (i.e. the second signal S1_2).

Moreover, if the signal component SC_2 (i.e. the first digital signal SC_2_1 and the second digital signal SC_2_2) considered by the designer is a signal around the sub-band of 1.863 GHz, the designer could suitably design the first factor and the second factor corresponding to the frequency dividing-phase shifting circuit 120_2, such that the first frequency signal FS1 is processed by the frequency dividing-phase shifting circuit 120_2 and is converted into the first signal S2_1 and the second signal S2_2 orthogonal to each other and having a frequency of 1.863 GHz.

Similarly, it is assumed that the frequency of the first frequency signal FS1 is adjusted to 7.452 GHz (i.e. 4 times of 1.863 GHz), the designer could design both of the first factor and the second factor corresponding to the frequency dividing-phase shifting circuit 120_2 to be 2. As a result, the frequency dividing-phase shifting circuit 120_2 could convert the first frequency signal FS1 with the frequency of 7.452 GHz to the first signal S2_1 and the second signal S2_2 orthogonal to each other and having the frequency of 1.863 GHz.

Then, the signal processing module 140_2 could obtain the signal component SC_2 (i.e. the first digital signal SC_2_1 and the second digital signal SC_2_2) around the sub-band of 1.863 GHz from the radio frequency signal RF according to the first signal S2_1 and the second signal S2_2.

Moreover, when the DVB receiver 500 adopts the DVB-C, DVB-C2, DVB-T or DVB-H standard, the designer could also correspondingly adjust the parameters of the components (for example, the frequency of the first frequency signal FS1 and the first factor and the second factor corresponding to each of the frequency dividing-phase shifting circuits) in the DVB receiver 500, so as to adaptively obtain the desired signal component from the radio frequency signal RF, and details thereof are not repeated.

In other embodiments, the designer could adjust the number of the frequency dividing-phase shifting circuits and the corresponding signal processing modules included in the DVB receiver 500 according to the number of the considered sub-bands. For example, when the designer considers the signal components belonging to 3 different sub-bands, the designer could adjust the DVB receiver 500 to include 3 sets of the frequency dividing-phase shifting circuit and signal processing module. Alternatively, when the designer considers the signal components belonging to 5 different sub-bands, the designer could adjust the DVB receiver 500 to include 5 sets of the frequency dividing-phase shifting circuit and signal processing module.

In summary, the digital video broadcast receiver proposed in the embodiments of the present invention could generate the first signals and the second signals having different frequencies by using different frequency dividing-phase shifting circuits in case that only a single frequency synthesizer is included. As a result, the various components included in the signal processing modules could be implemented by components with a lower specification, so as to reduce the cost of the DVB receiver. Moreover, since the DVB receiver of the invention only includes the single frequency synthesizer, the adverse pulling effect is avoided, so as to achieve an effect of low power consumption.

It will be apparent to those skilled in the art that various modifications and variations could be made to the structure of the invention without departing from the scope or spirit of the invention. In view of the foregoing, it is intended that the invention cover modifications and variations of this invention provided they fall within the scope of the following claims and their equivalents.

What is claimed is:

1. A digital video broadcast receiver, comprising:
    a frequency synthesizer, synthesizing a first frequency signal;
    a plurality of frequency dividing-phase shifting circuits, coupled to the frequency synthesizer, individually performing a frequency dividing-phase shifting operation on the first frequency signal to generate a plurality of first signals having different frequencies and a plurality of second signals corresponding to the first signals, wherein one of the plurality of first signals is orthogonal to one of the plurality of second signals corresponding to the one of the plurality of first signals;
    an antenna, receiving a radio frequency signal;
    a plurality of signal processing modules, coupled to the antenna and the frequency dividing-phase shifting circuits, and respectively obtaining a plurality of signal components belonging to different sub-bands from the radio frequency signal according to the plurality of first signals and the plurality of second signals,
    wherein the first frequency signal is a first differential signal, and each of the frequency dividing-phase shifting circuits comprises:
    a first frequency divider, coupled to the frequency synthesizer, and dividing a frequency of the first differential signal by a first factor to generate a second differential signal;
    a second frequency divider, coupled to the first frequency divider, and dividing a frequency of the second differential signal by a second factor to generate a third differential signal;
    a first D-type flip-flop, coupled to the first frequency divider and the second frequency divider, and outputting a first differential oscillation signal according to the second differential signal and the third differential signal, wherein the first differential oscillation signal is one of the first signals; and
    a second D-type flip-flop, coupled to the first frequency divider and the second frequency divider, and outputting a second differential oscillation signal according to the second differential signal and the third differential signal, wherein the second differential oscillation signal is one of the second signals,
    wherein the first differential oscillation signal and the second differential oscillation signal are orthogonal to each other.

2. The digital video broadcast receiver as claimed in claim 1, wherein the second factor is 2.

3. The digital video broadcast receiver as claimed in claim 1, wherein the first D-type flip-flop has a clock input terminal and a data terminal, the clock input terminal of the first D-type flip-flop receives the second differential signal, and the data terminal of the first D-type flip-flop receives the third differential signal,
    wherein the second D-type flip-flop has a clock input terminal and a data terminal, the clock input terminal of the second D-type flip-flop receives the second differential signal, and the data terminal of the second D-type flip-flop receives the third differential signal.

4. The digital video broadcast receiver as claimed in claim 1, wherein each of the signal processing modules comprises:
    a first mixer, coupled to a specific frequency dividing-phase shifting circuit and the antenna, and mixing the radio frequency signal and a first differential oscillation signal to generate a first sub-band signal, wherein the specific frequency dividing-phase shifting circuit is one of the frequency dividing-phase shifting circuits, and the first differential oscillation signal is one of the first signals; and
    a second mixer, coupled to the specific frequency dividing-phase shifting circuit and the antenna, and mixing the radio frequency signal and a second differential oscillation signal to generate a second sub-band signal orthogonal to the first sub-band signal, wherein the second differential oscillation signal is one of the second signals,
    wherein the first sub-band signal and the second sub-band signal belong to a same sub-band.

5. The digital video broadcast receiver as claimed in claim 4, wherein each of the signal processing modules further comprises:
    a first filter, coupled to the first mixer, and filtering the first sub-band signal;
    a first amplifier, coupled to the first filter, and amplifying the filtered first sub-band signal to generate a first amplified signal;
    a first analog-to-digital converter, coupled to the first amplifier, and sampling the first amplified signal to generate a first digital signal;
    a second filter, coupled to the second mixer, and filtering the second sub-band signal
    a second amplifier, coupled to the second filter, and amplifying the filtered second sub-band signal to generate a second amplified signal; and
    a second analog-to-digital converter, coupled to the second amplifier, and sampling the second amplified signal to generate a second digital signal.

6. The digital video broadcast receiver as claimed in claim 5, further comprising:
    a specific frequency divider, coupled to the frequency synthesizer, the first analog-to-digital converter and the second analog-to-digital converter, and performing a frequency dividing operation on the first frequency signal to generate a sampling signal.

7. The digital video broadcast receiver as claimed in claim 6, wherein the first analog-to-digital converter samples the first amplified signal according to the sampling signal to generate the first digital signal, and the second analog-todigital converter samples the second amplified signal according to the sampling signal to generate the second digital signal.

8. The digital video broadcast receiver as claimed in claim 1, further comprising:
- a low noise amplifier, having an input terminal and an output terminal, wherein the input terminal of the low noise amplifier is coupled to the antenna, and the output terminal of the low noise amplifier is coupled to the signal processing modules for providing the amplified radio frequency signal to the signal processing modules.

9. The digital video broadcast receiver as claimed in claim 8, further comprising:
- a plurality of band selection filters, respectively coupled between the output terminal of the low noise amplifier and the corresponding signal processing module.

10. A radio frequency (RF) receiving system, comprising:
- a frequency synthesizer, synthesizing a first frequency signal;
- a plurality of frequency dividing-phase shifting circuits, coupled to the frequency synthesizer, individually performing a frequency dividing-phase shifting operation on the first frequency signal to generate a plurality of first signals having different frequencies and a plurality of second signals corresponding to the first signals, wherein one of the plurality of first signals is orthogonal to one of the plurality of second signal corresponding to the one of the plurality of first signals;
- an antenna, receiving a radio frequency signal;
- a plurality of signal processing modules, coupled to the antenna and the frequency dividing-phase shifting circuits, and respectively obtaining a plurality of signal components belonging to different sub-bands from the radio frequency signal according to the plurality of first signals and the plurality of second signals, wherein the first frequency signal is a first differential signal, and each of the frequency dividing-phase shifting circuits comprises:

a first frequency divider, coupled to the frequency synthesizer, and dividing a frequency of the first differential signal by a first factor to generate a second differential signal;

a second frequency divider, coupled to the first frequency divider, and dividing a frequency of the second differential signal by a second factor to generate a third differential signal;

a first D-type flip-flop, coupled to the first frequency divider and the second frequency divider, and outputting a first differential oscillation signal according to the second differential signal and the third differential signal, wherein the first differential oscillation signal is one of the first signals; and a second D-type flip-flop, coupled to the first frequency divider and the second frequency divider, and outputting a second differential oscillation signal according to the second differential signal and the third differential signal, wherein the second differential oscillation signal is one of the second signals, wherein the first differential oscillation signal and the second differential oscillation signal are orthogonal to each other.

* * * * *